United States Patent [19]
Keenan

[11] Patent Number: 5,196,703
[45] Date of Patent: Mar. 23, 1993

[54] READOUT SYSTEM AND PROCESS FOR IR DETECTOR ARRAYS

[75] Inventor: William F. Keenan, Plano, Tex.

[73] Assignee: Texas Instruments Incorporated, Dallas, Tex.

[21] Appl. No.: 766,879

[22] Filed: Sep. 27, 1991

[51] Int. Cl.$^5$ .............................................. H01L 31/08
[52] U.S. Cl. ................................ 250/332; 250/214 A
[58] Field of Search ............................ 250/332, 214 A

[56] References Cited

U.S. PATENT DOCUMENTS 5,038,026 8/1991 Krause ............................. 250/214 A Primary Examiner—Carolyn E. Fields
Attorney, Agent, or Firm—Ira S. Matsil; James C. Kesterson; Richard L. Donaldson

[57] ABSTRACT

A method of detecting the intensity of radiation emanating from an object 116 relative to a background level at a pixel detector 120 is disclosed herein. A resistive element 122 with a resistance dependent upon the intensity of radiation impinging the detector 120 and having first and second terminals is provided along with an integration element 124 coupled to the first terminal of the resistive element. The first terminal is set to a reference voltage. The radiation is then defocused such that the radiation impinging the detector 120 is proportional to the background radiation level and a first voltage is applied to the second terminal of the resistive element 122 such that the integration element 124 discharges to a background voltage level. Next, the radiation is focused such that the radiation impinging the detector 120 is proportional to the radiation emanating from the object 116 and a second voltage is applied to the second terminal of the resistive element 122 such that the integration element 124 charges to an output voltage $V_o$ level. The output voltage $V_o$ is then sensed. Other systems and methods are also disclosed.

18 Claims, 3 Drawing Sheets

READOUT SYSTEM AND PROCESS FOR IR DETECTOR ARRAYS

FIELD OF THE INVENTION

This invention generally relates to the fabrication of semiconductor devices and specifically to a readout system and process for infrared detector arrays.

BACKGROUND OF THE INVENTION

Detection of infrared radiation emitted by warm bodies provides an important method for night vision (perception without visible light). Infrared detectors may be classified in various ways, such as scanning or staring arrays, cryogenic (typically liquid nitrogen temperatures) or uncooled detectors, 3-5 micron or 8-12 micron spectral sensitivity range, and photon or thermal detection mechanism. For portable, low power applications where the greater detectivity of cryogenic detectors is not needed, the preferred choice is an uncooled thermal detector: infrared photons are absorbed and the resultant heating of the absorbing element is detected. The thermal detector is usually one of three types: (1) pyroelectric detector, (2) thermocouple, or (3) bolometer.

In the operation of an infrared (IR) image sensing array, the desired output signal is obtained from the difference between two consecutive array outputs. The first output is obtained with the IR image deliberately defocused on the array and is used to determine the background flux associated with the scene. The second output is obtained with the image sharply focused on the array.

Typically, the signals from either the dark frame or from both frames are digitized and stored in memory for subsequent signal processing operation. This analog to digital conversion and storage memory add to the cost and complexity of the overall imaging system.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for reading information from an infrared detector.

A method of detecting the intensity of radiation emanating from an object relative to a background level at a pixel detector is disclosed herein. A resistive element with a resistance dependent upon the intensity of radiation impinging the detector and having first and second terminals is provided along with an integration element coupled to the first terminal of the resistive element. The first terminal is set to a reference voltage. The radiation is then defocused such that the radiation impinging the detector is proportional to the background radiation level and a first voltage is applied to the second terminal of the resistor such that the integration element discharges to a background voltage level. Next, the radiation is focused such that the radiation impinging the detector is proportional to the radiation emanating from the object and a second voltage is applied to the second terminal of the resistor such that the integration element charges to an output voltage level. The output voltage is then sensed.

A pixel detector for detecting radiation emanating from an object is also disclosed herein. A resistive element with a resistance dependent upon the object radiation and having first and second terminals is provided. A capacitor is coupled to the first terminal of the resistive element as well as circuitry for applying a reference voltage. A shutter for focusing and defocusing radiation is also provided. A first voltage is applied to the second terminal of the resistive element when the radiation is defocused and a second voltage is applied to the second terminal of the resistive element when the radiation is focused. The output voltage is read from the first terminal of the resistor.

An advantage of the invention is that it reduces dynamic range requirements on the preamplifier. This simplifies the overall system design. In addition, external "dark" frame storage (i.e., background) requirements are eliminated. This reduces the amount of memory necessary.

Further, the effects of radiation independent currents on pixel performance are minimized since these currents will be calibrated out. Still further, the effects of drift in the mean pixel temperature on detector performance are minimized.

Even further still, the present invention allows the electrical integration time to be substantially less than the frame time which is an advantage in the capacitance/resistor current performance tradeoff.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

Figure 1:
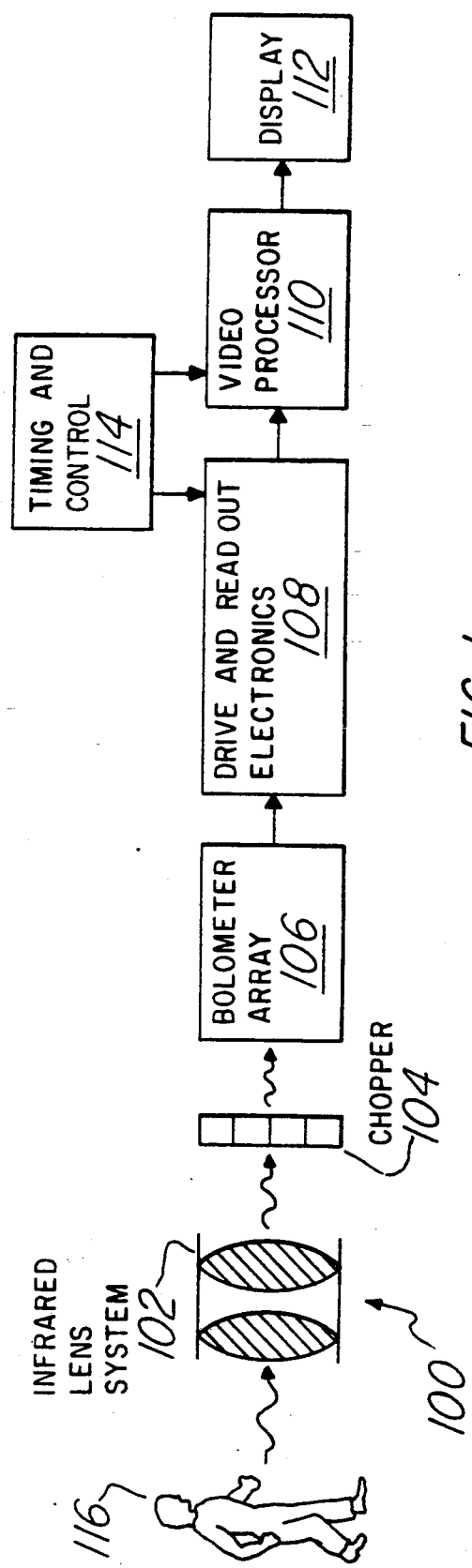
FIG. 1 shows a block diagram of an infrared detector system which includes a first preferred embodiment bolometer array.

FIG. 1 illustrates in schematic diagram view an infrared imagery system, generally noted 100, which includes infrared lens system 102 which may include a shutter for focusing and defocusing the infrared image, mechanical chopper 104, bolometer array 106, drive and readout electronics 108 for array 106, video processor 110, display 112, and timing and control electronics 114. The lens system 102 images infrared radiation emitted by warm object 116 onto array 106. Chopper 104 may be a rotating disk which periodically defocuses the infrared radiation collected by lens system 102. In one embodiment, array 106 includes 65,536 bolometers arranged in 256 rows by 256 columns; each bolometer corresponds to a pixel in the image of the warm body 116 plus surrounding scene in the field of view of the lens system 102. Array 106 may be housed in a vacuum chamber or be surrounded by a low thermal conductivity atmosphere. An infrared transparent window is formed in one side of the device package. The window is positioned so that radiation from the scene with warm body 116 passes through the window onto array 106.

Figure 2:
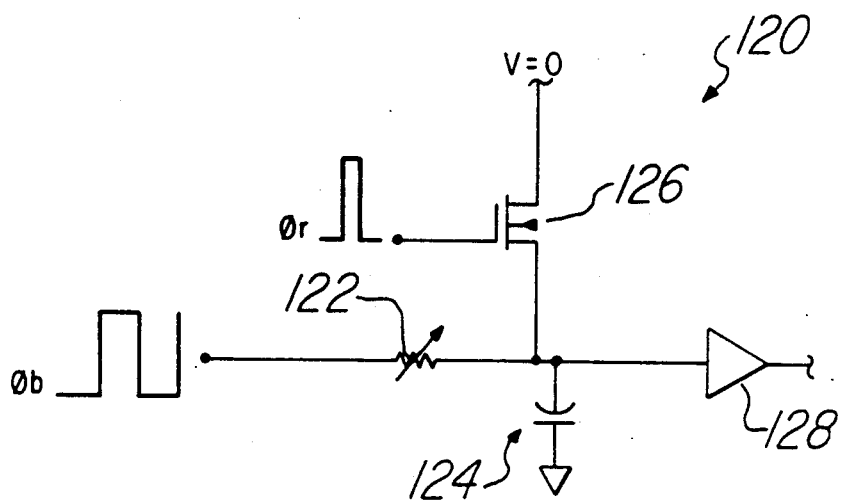
FIG. 2 shows a schematic diagram of a pixel detector.

The following description relates primarily to the bolometer array 106 and the drive and read out electronics 108 as well as the focusing/defocusing shutter which is included in lens system 102 and/or chopper 104. FIG. 2 shows one pixel detector 120 in the array 106. The pixel detector 120 comprises a temperature dependent resistor 122. During operation, the temperature of resistor 122 will be proportional to the intensity of the radiation impinging upon the pixel. Any of the many known pixel configurations may be used. Examples of uncooled bolometer pixel configurations are given in U.S. Pat. No. 5,021,663 and in co-pending application Ser. No. 768,801.

The resistor 122 is coupled to a bias voltage $\Phi_b$ at one terminal and an integration capacitor 124 at the other terminal. Many methods of fabricating capacitors in integrated circuits are known and any of these capacitors may be used. A reset switch 126 is also coupled to the node with resistor 122 and capacitor 124. As an example, the reset switch 126 may be a field effect transistor as illustrated in FIG. 2. Preamplifier 128 is coupled to the same node to sense the value of the voltage on capacitor 124. Known signal multiplexing may be used after the preamplifier output, but this is not critical to the invention herein.

In operation, the temperature dependent resistor 122 charges the capacitor 124 for a fixed time and hence the voltage on the capacitor 124 is related to the resistor 122 temperature, which of course is related to the intensity of the radiation impinging the pixel.

In one aspect, the present invention provides a new readout method where the background subtraction issue is handled at the detector level. The method may be most applicable to arrays of bolometer detectors, but can be applied in a generalized form to other uncooled (or cooled) detector arrays. Applying this readout method eliminates the need for external memory and reduces the dynamic range needed by the pixel preamplifier 128.

Figure 3:
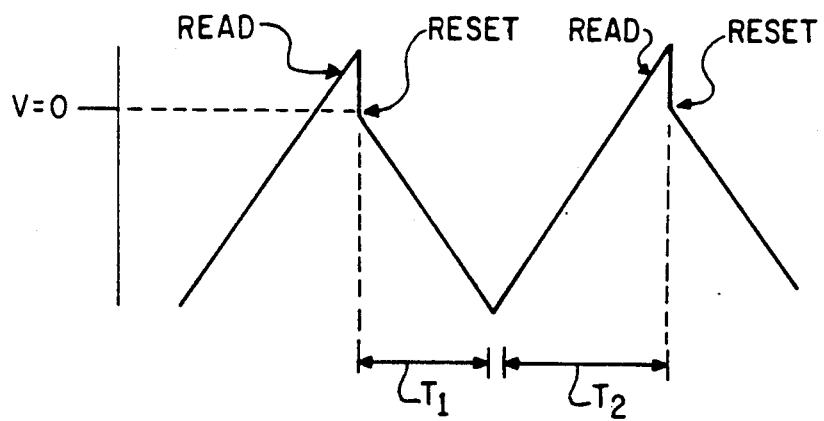
FIG. 3 shows an exemplary output voltage.

The voltage on the output of the capacitor 124 is shown in FIG. 3. In the operation of the sensing array, the desired output signal is obtained from the difference between two consecutive array outputs. The first output is obtained with the IR image deliberately defocused on the array and is used to determine the background flux associated with the scene. The background is determined during time period $T_1$ while the capacitor discharges to the appropriate value. The second output is obtained with the image sharply focused on the array. The image is determined during time period $T_2$ while the capacitor charges to the appropriate (i.e., proportional to the impinging radiation) value.

Figure 4:
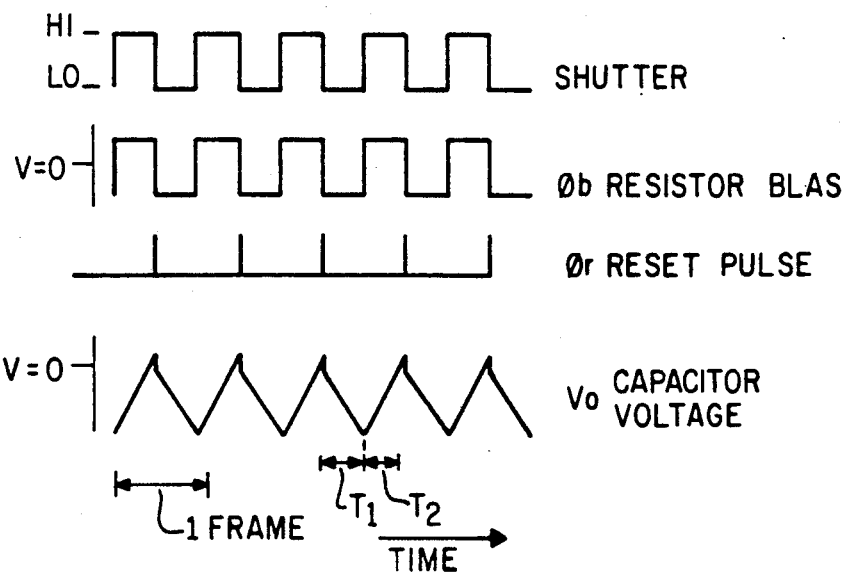
FIG. 4 illustrates a first embodiment timing diagram.

Operation will be better understood by reference to FIG. 4 which shows the relationship between the shutter, the resistor bias $\Phi_b$, the reset pulse $\Phi_r$, and the output voltage $V_o$ on the capacitor. The shutter is defined as being having a focused image in the high state and an defocused image in the low state. In practice the shutter may be any method which adjusts the focusing of the radiation on the array. Although not illustrated, more than two states of focus may be possible.

The waveforms and voltages are presented for discussion of the principles of operation and do not represent the exclusive method for proper operation. For example the phase relationships between the waveforms and bias levels may be adjusted.

Operation of the proposed readout process is best understood by beginning the description of operation immediately after the detector has completed integration and has been readout (i.e., at the beginning of time period $T_1$). The voltage on integration capacitor 124 is then clamped to a reference value, $V=0$ for illustration, and the bias on the resistor 122 is switched to a first fixed value which is less than the reference value $V=0$ (e.g., negative). The shutter is in the defocused mode, and the voltage on the integration capacitor 124 is decreasing in proportion to time and the temperature of the resistor 122. Since the shutter is defocused the resistor temperature is proportional to the background radiation level. The voltage across the capacitor 124 reaches a minimum value just prior to the shutter transition to the focused mode and the switching of the bias across the resistor 122 to the second fixed value which is greater than the reference voltage $V=0$ (e.g., positive). This minimum capacitor voltage is a function of the resistor temperature during integration, i.e. dependent on the "dark" scene background level.

With the bias across the resistor positive and the shutter in the focused mode, the voltage across the capacitor 124 increases with time and the resistor temperature which now is proportional to the image radiation intensity level. At the end of the shutter open time, the voltage across the resistor is readout by the preamplifier. This voltage represents the difference between the background and signal levels of the scene.

In this system, the preamplifier 128 must only sense this one difference signal which is much smaller than either the image or background signals. Both the direct and background signals would have to pass through the amplifier 128 if external differencing is used.

In typical applications, the signal is sampled 60 times per second (i.e., 60 Hz). This signal would be compatible with typical video applications. Methods of displaying the array on a display are known in the art.

Figure 5:
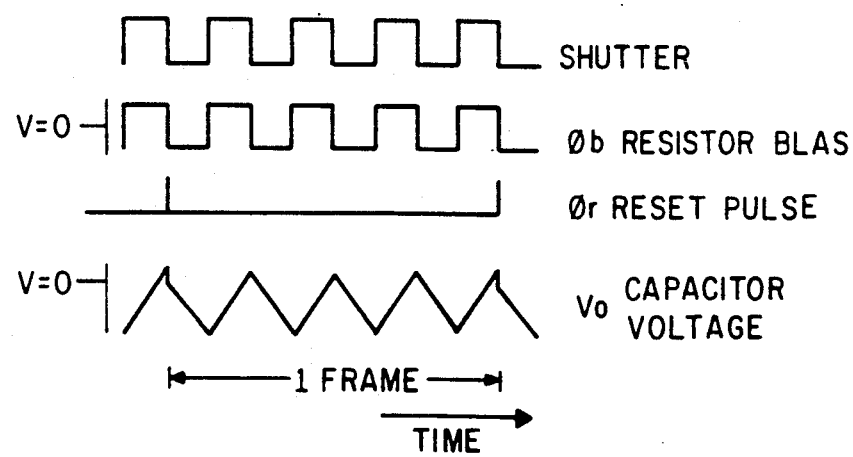
FIG. 5 illustrates a second embodiment timing diagram.

It should be noted that this operating mode requires the time constant of the temperature dependent resistor and integration capacitor to exceed the frame time of the system to avoid saturation of the integration capacitor. In practice, the size of the integration capacitor and the size of the temperature dependent resistor are limited by fabrication constraints and shot noise considerations. Hence, the integration time constant will in general be less than the frame time. Under these conditions, the operation can be revised to synchronize the shutter and $\phi_b$ while $\phi_r$ and the readout remain synchronized with the frame rate. In this mode of operation, shown in FIG. 5, the shutter speed will be a multiple of the frame rate and will be limited at the high end by the thermal time constant of the pixel.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A pixel detector for detecting radiation emanating from an object comprising:
   a resistive detector element with a resistance dependent upon said radiation and having first and second terminals;
   a capacitor coupled to the first terminal of said resistive detector element;
   circuitry for applying a reference voltage to the first terminal of said resistive detector element;
   a shutter for focusing and defocusing said radiation;
   bias circuitry for applying a first voltage to the second terminal of said resistive element when said radiation is defocused and for applying a second voltage to the second terminal of said resistive element when said radiation is focused; and
   circuitry for sensing an output voltage on the first terminal of said resistive detector element, said output voltage substantially dependent upon said radiation.

2. The detector of claim 1 wherein said resistive element is a temperature dependent resistor with a temperature proportional to said radiation.

3. The detector of claim 1 wherein said circuitry for applying a reference voltage comprises a transistor.

4. The detector of claim 1 wherein said circuitry for sensing an output voltage comprises a preamplifier.

5. The detector of claim 1 wherein said reference voltage is zero volts.

6. The detector of claim 1 wherein said first voltage is less than said reference voltage and said second voltage is greater than said reference voltage.

7. The detector of claim 1 wherein said pixel detector is one detector in an array of detectors.

8. The detector of claim 1 wherein said reference voltage is applied 60 times per second.

9. The detector of claim 1 wherein said radiation comprises infrared radiation.

10. The detector of claim 1 wherein said radiation is focused for substantially the same amount of time as said radiation is defocused.

11. A method of detecting the intensity of radiation emanating from an object relative to a background level at a pixel detector, comprising the steps of:
    providing a resistive element with a resistance dependent upon the intensity of radiation impinging said detector and having first and second terminals;
    providing an integration element coupled to the first terminal of said resistive element;
    setting said first terminal to a reference voltage;
    defocusing said radiation such that the radiation impinging said detector is proportional to said background radiation level and applying a first voltage to the second terminal of said resistive element such that said integration element discharges to a background voltage level;
    focusing said radiation such that the radiation impinging said detector is proportional to the radiation emanating from said object and applying a second voltage to the second terminal of said resistive element such that said integration element charges to an output voltage level; and
    sensing said output voltage level.

12. The method of claim 11 wherein said resistive element is a temperature dependent resistor with a temperature proportional to said radiation.

13. The method of claim 11 wherein said integration element is a capacitor.

14. The method of claim 11 wherein said reference voltage is zero volts.

15. The method of claim 11 wherein said first voltage is less than said reference voltage and said second voltage is greater than said reference voltage.

16. The method of claim 11 wherein said setting, defocusing, focusing, and sensing steps are performed repetitively.

17. The method of claim 16 wherein said setting, defocusing, focusing, and sensing steps are performed 60 times per second.

18. A pixel detector for detecting radiation emanating from an object comprising:
    a resistive detector element with a resistance dependent upon said radiation, said resistive detector element having first and second terminals;
    a capacitor coupled directly to said first terminal of said resistive detector element;
    circuitry for applying a reference voltage to the first terminal of said resistive detector element;
    a shutter for focusing and defocusing said radiation;
    bias circuitry for applying a first voltage to the second terminal of said resistive element when said radiation is defocused and for applying a second voltage to the second terminal of said resistive element when said radiation is focused; and
    circuitry for sensing an output voltage on the first terminal of said resistive detector element.

* * * * *